METHOD OF IMPROVING ADHESION OF COPPER-EPOXY GLASS LAMINATES

Filed Oct. 7, 1968

INVENTORS
MARJI M. GOLDSMITH
GORDON A. NIELSEN
BY Robert G Rogers
ATTORNEY

United States Patent Office 3,536,546

Patented Oct. 27, 1970

3,536,546

METHOD OF IMPROVING ADHESION OF COPPER-EPOXY GLASS LAMINATES

Gordon A. Nielsen, Newport Beach, and Marji M. Goldsmith, Brea, Calif., assignors to North American Rockwell Corporation Filed Oct. 7, 1968, Ser. No. 765,534
Int. Cl. B32b *31/14*
U.S. Cl. 156—3 6 Claims

ABSTRACT OF THE DISCLOSURE

Copper circuitry layers bonded to epoxy glass laminates are coated with an electroless or immersion solution of tin prior to being bonded to layers of "B" stage epoxy resin disposed between adjacent copper circuitry layers for forming a multilayer board.

BACKGROUND OF THE INVENTION

Field of the invention

The invention relates to a process for improving the lamination between multilayer boards and in particular to such a process using an electroless or immersion applied layer of tin, etc., to the circuitry layers for increasing the adhesion between the circuit boards of a multilayer combination.

Description of prior art

Existing processes use heat and pressure to bond copper circuitry to an intermediate epoxy resin layer in producing multilayer boards. Acid etchants may be used to roughen the copper circuitry so that bonding is improved. An oxide or sulfide film may also be coated to the copper circuitry for improving the tensile strength. However, such processes often produce boards having relatively poor tensile strength. A 30% loss in boards due to improper adhesion between layers is not uncommon.

Patent No. 3,136,680, to J. Hochberg, for a Polytetrafluoroethylene Copper Laminate teaches a process for bonding polytetrafluoroethylene, to a co-polymer layer and a layer of copper circuitry.

Although the patent teaches a process using tin, nickel, cadmium, and alloys of the three materials, its teachings are concerned with improving adhesion between the three materials described above. The tin, etc., is applied by an electroplating process. The present invention is concerned with improving adhesion between copper and an epoxy glass layer by using a thin coating of tin, nickel, cadmium, etc. deposited from an immersion or electroless solution. Other differences are described in the following paragraphs.

SUMMARY OF THE INVENTION

Briefly, the invention comprises immersing copper clad epoxy glass laminates in a solution of tin, nickel, cadmium, and alloys of the three elements until a suitable deposit is formed on the copper layers. A solution which does not require the use of electricity is used. The copper layers are previously etched into required circuit patterns.

Electroless or immersion plating is used instead of electroplating to avoid the requirements of connecting electrodes to circuitry areas and because of the expense in using the latter process. Electroplating requires the use of expensive masking techniques to accomplish pattern plating. Electroless plating is relatively more simple and easier to use since the metal in the solution adheres only to the copper comprising the circuitry.

A layer of "B" stage epoxy resin, or "prepreg," is placed between the coated copper layers and the boards are processed according to known techniques until the layers are bonded.

The process may also be used to improve the adhesion between a layer of copper and the substrate material comprising epoxy glass. In that case, the copper layer is immersed in the solution prior to being bonded to the epoxy glass substrate.

Therefore, it is an object of this invention to improve adhesion between a copper layer and an epoxy material by coating the copper layer with a relatively thin layer of tin or a similar material deposited from a solution not requiring the use of electricity.

Still a further object of this invention is to improve adhesion between circuit boards of a multilayer board by electroless coating copper circuitry layers with tin or a similar material before bonding the coated layers to an epoxy resin layer between the circuitry layers.

Still a further object of the invention is to provide an improved laminating process for reducing the number of discarded multilayer boards due to inadequate bonding between layers.

A still further object of the invention is to improve tensile shear strength between layers of a multilayer board without the necessity for acid baths, or for applying oxide or sulfide coatings to the copper circuitry of the circuit boards.

A further object of the invention is to improve adhesion between circuit boards of a multilayer board by electroless plating tin or a similar material to the copper layers of the multilayer boards instead of applying the tin or similar material using an electroplating process.

These and other objects of this invention will become more apparent when taken in connection with the following drawings.

DESCRIPTION OF THE PREFERRED EMBODIMENTS

Figure 1:
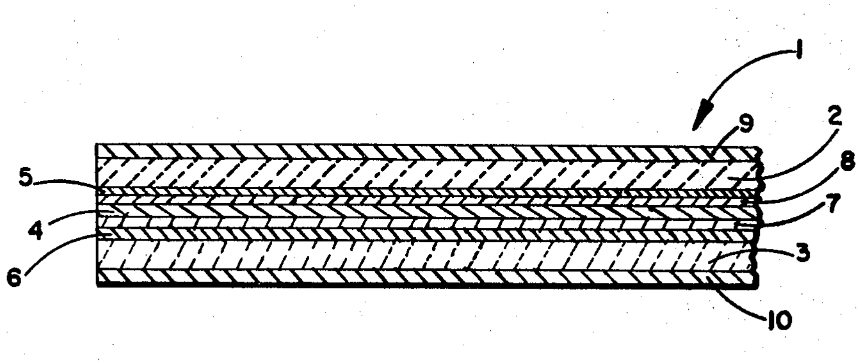
FIG. 1 shows a cross-sectional view of a multilayer board having improved adhesion between the circuit boards because of an electroless coating on the circuitry layers.

As shown by FIG. 1, multilayer board 1 comprises copper clad epoxy glass laminates 2 and 3 bonded together by a "B" stage epoxy resin, or "prepreg," layer 4. Copper circuitry layers 5 and 6, bonded to the inner surfaces of the substrates of laminates 2 and 3, respectively, are etched to a required circuitry configuration after being bonded to the substrates and prior to the assembly of the multilayer board as shown. Copper layers 9 and 10 on the outer surfaces of the substrates are ordinarily etched to a circuit configuration as a final step of a multilayer board process.

Copper layers 5 and 6 are electroless or immersion coated with relatively thin layers of tin identified by numerals 7 and 8 before the laminates are assembled.

Although tin is described as being deposited on the surfaces of the circuitry, it should be obvious that other materials similar to tin such as nickel, cadmium, and alloys of the three materials could also be applied by means of an immersion bath.

The copper coated layers are bonded to prepreg layer 4 which is inserted between the coated layers 5 and 6 as part of the assembly process.

Figure 2:
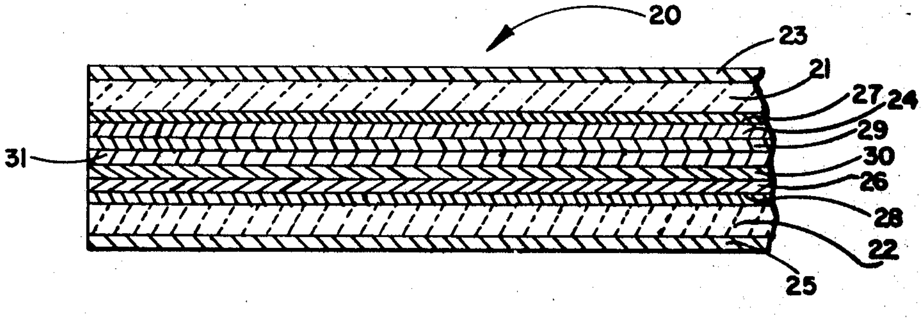
FIG. 2 shows a second example of a multilayer board produced by the process described herein.

It should be understood that although the tin layers as shown for improving adhesion between the copper layers and the prepreg layer, it can also be used to improve adhesion between copper layers and their respective epoxy glass substrates. FIG. 2 shows multilayer board 20 comprising copper clad laminates 21 and 22. Copper layers 23 and 24, 25 and 26 are bonded to the outer surfaces of the substrates of laminates 21 and 22, respectively. Copper layers 24 and 26 are etched into a circuit configuration after being bonded to the substrates and prior to the assembly of the laminates for forming the multilayer board.

However, prior to bonding layers 24 and 26 to the substrates, the layers are coated in a solution of tin, layers 27 and 28, respectively, for improving the adhesion of the layers to the substrates. Copper layers 23 and 25 could be similarly coated prior to being bonded to the substrates.

Second tin layers 29 and 30 are deposited on the circuitry layers 24 and 26 from the solution.

After the tin, or other material, as the case may be, has been deposited, the laminates are assembled as shown with prepreg layer 31 interposed between the laminates. After assembly, the laminates are bonded together, and the outer copper layers 23 and 25 are etched. Through holes could be drilled and electrical interconnections between layers could also be made as required for a particular application to complete the multilayer board process.

In producing the deposit for FIG. 1 and FIG. 2 embodiments the copper clad board is immersed in an appropriate solution of tin, nickel, cadmium, etc., for a period of approximately three minutes until a deposit of between 0.01 and 0.3 mil results. A temperature of approximately 350° F. is required to bond the layers together under pressure. Other details in bonding the boards together for forming a multilayer board are known to persons skilled in the art. Plating solutions such as the immersion and electroless solution usable in connection with the present invention are known to persons skilled in the art. Such details are therefore not included as part of this description.

The following examples illustrate specific embodiment processes of the invention.

EXAMPLE 1

One or both surfaces of a sheet of copper foil of thickness ranging between .1 and 6.0 mils is coated with a layer of tin by means of dipping into an immersion tin plating bath consisting of tin chloride (2½ oz./gal.), sodium cyanide (25 oz./gal.), and sodium hydroxide (—3 oz./gal.) at room temperature. Other well known formulations for this type of deposit may be used as well as formulations utilizing the electroless or autocatalytic principle. Suitable masking techniques may be used on one side of the foil. A typical thickness of the tin deposit 0.01–0.03 mil.

An assembly is prepared by placing the copper foil over one or more layers of partially cured epoxy impregnated glass mat (prepreg) with the tin coated surface in contact with the mat. The resultant assembly is heated using temperatures ranging between 300° F.–400° F. and pressure ranging between 100–1000 p.s.i. Typical curing times range from 15–60 minutes dependent upon the particular epoxy resin formulation used.

By applying tin coated copper foil to both sides of the epoxy glass prepreg layer and proceeding through the curing cycle, double clad copper epoxy glass laminate may be fabricated. The resultant bond between the copper foil and cured epoxy glass substrate have tensile shear strengths ranging between 2000–2500 pounds per square inch.

EXAMPLE 2

Multilayer interconnection boards having improved interlaminar bond strength are also fabricated by using the following process.

Two or more double clad copper epoxy glass laminates are processed using well known photo masking and etching techniques to form the desired circuit configuration. The remaining copper circuitry is coated with tin using techniques described in Example 1.

An assembly is prepared by making a stack consisting of alternating layers of the above tin coated copper epoxy glass circuit boards and one or more layers of epoxy glass prepreg between each circuit board. The resultant assembly is heated using temperatures, pressure, and time as described in Example 1.

Interconnections between the various circuit layers may be obtained by well known techniques such as drilling and plating the holes. Assemblies made by this process are found to exhibit superior interlaminar strengths when subjected to the further processing normally required in multilayer circuit board fabrication such as hot oil solder flowing and wave soldering.

Although the invention has been described and illustrated in detail, it is to be understood that the same is by way of illustration and example only, and is not taken by way of limitation; the spirit and scope of this invention being limited only by the items of the appended claims.

We claim:

1. A process for improving the adhesion between a copper layer and an epoxy containing material comprising the steps of, immersing the copper layer in either one of an electroless or immersion solution until a plated metal deposit of at least 0.01 mil results, said plated metal being selected from the group consisting of tin, nickel, cadmium and alloys thereof, placing the plated copper layer in contact with the epoxy containing material, and bonding the copper layer to the epoxy containing material under a predetermined temperature and pressure.

2. The process recited in claim 1 wherein said copper layer is bonded to an epoxy glass substrate after being immersed in said solution and wherein the steps of, etching said copper layer into a circuit configuration, and immersing said circuit into a said solution occur prior to bonding said layer to said epoxy containing material.

3. The process as recited in claim 1 including the steps of bonding the copper layer to an epoxy glass substrate prior to immersing the copper layer to the solution.

4. The process recited in claim 1 wherein said copper layer is etched into a circuit configuration and a second epoxy glass substrate is bonded to said etched circuit;

immersing a second copper layer in either one of an electroless or immersion solution until a plated metal deposit of at least 0.01 mil results, said plated metal being selected from the group consisting of tin, nickel, cadmium and alloys thereof;

placing said second copper layer in contact with said second epoxy glass substrate;

bonding said second copper layer to the second epoxy glass substrate under a predetermined temperature and pressure, and etching said second copper layer into a circuit configuration.

5. The process recited in claim 1 wherein said solution is an electroless solution.

6. The process recited in claim 1 wherein said solution is an immersion solution and said metal is a metal selected from the class consisting of tin, nickel, cadmium, and alloys of tin, nickel, cadmium.

References Cited

UNITED STATES PATENTS 3,136,680 6/1964 Hochberg -------- 117—217 X

HAROLD ANSHER, Primary Examiner

J. C. GIL, Assistant Examiner

U.S. Cl. X.R.

117—47, 212, 217, 218; 156—18; 161—186